United States Patent
Yamamoto et al.

(10) Patent No.: US 9,310,524 B2
(45) Date of Patent: Apr. 12, 2016

(54) FILM DEPOSITION APPARATUS AND FILM DEPOSITION METHOD

(71) Applicant: ULVAC, INC., Kanagawa (JP)

(72) Inventors: Haruhiko Yamamoto, Chigasaki (JP); Kenjiro Kokubu, Chigasaki (JP)

(73) Assignee: Ulvac, Inc. (JP)

( * ) Notice: Subject to any disclaimer, the term of this patent is extended or adjusted under 35 U.S.C. 154(b) by 64 days.

(21) Appl. No.: 14/306,321

(22) Filed: Jun. 17, 2014

(65) Prior Publication Data

US 2014/0295104 A1    Oct. 2, 2014

Related U.S. Application Data

(62) Division of application No. 12/919,577, filed as application No. PCT/JP2009/057228 on Apr. 8, 2009, now abandoned.

(30) Foreign Application Priority Data

Apr. 9, 2008  (JP) ................................. 2008-101606

(51) Int. Cl.
*H05H 1/00* (2006.01)
*G02B 1/10* (2015.01)
(Continued)

(52) U.S. Cl.
CPC ... *G02B 1/105* (2013.01); *B05D 1/60* (2013.01); *B05D 3/108* (2013.01); *C23C 8/36* (2013.01);
(Continued)

(58) Field of Classification Search
CPC .......... C23C 8/36; C23C 14/14; C23C 14/34; C23C 14/3407; C23C 14/505; C23C 14/5853
See application file for complete search history.

(56) References Cited

U.S. PATENT DOCUMENTS 4,113,691 A * 9/1978 Ward ................. C08G 65/2612
427/214
5,266,358 A   11/1993 Uemura et al.
(Continued)

FOREIGN PATENT DOCUMENTS

JP   05-239243   9/1993
JP   05-345641   12/1993
(Continued)

OTHER PUBLICATIONS

International Search Report prepared by the Japanese Patent Office on May 12, 2009, for International Application No. PCT/JP2009/057228.

(Continued)

*Primary Examiner* — Michael Wieczorek
(74) *Attorney, Agent, or Firm* — Sheridan Ross P.C.

(57) ABSTRACT

A film formation device (10) that increases the mechanical resistance of the liquid repellent film formed on the oxide film. The film formation device (10) includes an oxide film formation unit (14, 15, 16), which forms an oxidized film on a substrate by releasing grains towards the substrate that is rotated in a vacuum chamber (11), and forms an oxide film on the substrate by emitting oxygen plasma towards the oxidized film. A vapor deposition unit (17) vapor-deposits a silane coupling agent, which contains a hydrolytic polycondensation group and a liquid repellent group, on the oxide film. A polycondensation unit (20) polycondenses the silane coupling agent by supplying water towards the oxide film on the rotated substrate. The polycondensation unit supplies water to the oxide film before the vapor deposition unit vapor deposits the silane coupling agent on the oxide film.

2 Claims, 3 Drawing Sheets

(51) Int. Cl.
  *B05D 3/10* (2006.01)
  *C23C 8/36* (2006.01)
  *C23C 14/00* (2006.01)
  *C23C 14/56* (2006.01)
  *C23C 14/58* (2006.01)
  *C23C 28/00* (2006.01)
  *C23C 28/04* (2006.01)
  *B05D 1/00* (2006.01)
  *B05D 5/08* (2006.01)

(52) U.S. Cl.
  CPC ........... *C23C 14/0078* (2013.01); *C23C 14/568* (2013.01); *C23C 14/5853* (2013.01); *C23C 28/00* (2013.01); *C23C 28/04* (2013.01); *B05D 1/002* (2013.01); *B05D 5/083* (2013.01)

(56) References Cited

U.S. PATENT DOCUMENTS

| | | | | |
|---|---|---|---|---|
| 5,523,162 A | * | 6/1996 | Franz | C03C 17/009 427/384 |
| 5,618,388 A | | 4/1997 | Seeser et al. | |
| 6,103,320 A | * | 8/2000 | Matsumoto | C23C 14/0047 204/192.12 |
| 2011/0014398 A1 | | 1/2011 | Yamamoto et al. | |

FOREIGN PATENT DOCUMENTS

| | | |
|---|---|---|
| JP | 11-012375 | 1/1999 |
| JP | 2007-247028 | 9/2007 |

OTHER PUBLICATIONS

International Preliminary Report on Patentability (English translation) for International Application No. PCT/JP2009/057228, issued Nov. 30, 2010.
Official Action for U.S. Appl. No. 12/919,577 mailed May 2, 2013, 6 pages.
Official Action for U.S. Appl. No. 12/919,577 mailed May 30, 2013, 13 pages.
Official Action for U.S. Appl. No. 12/919,577 mailed Nov. 20, 2013, 11 pages.
Official Action for U.S. Appl. No. 12/919,577 mailed Mar. 21, 2014, 13 pages.

* cited by examiner

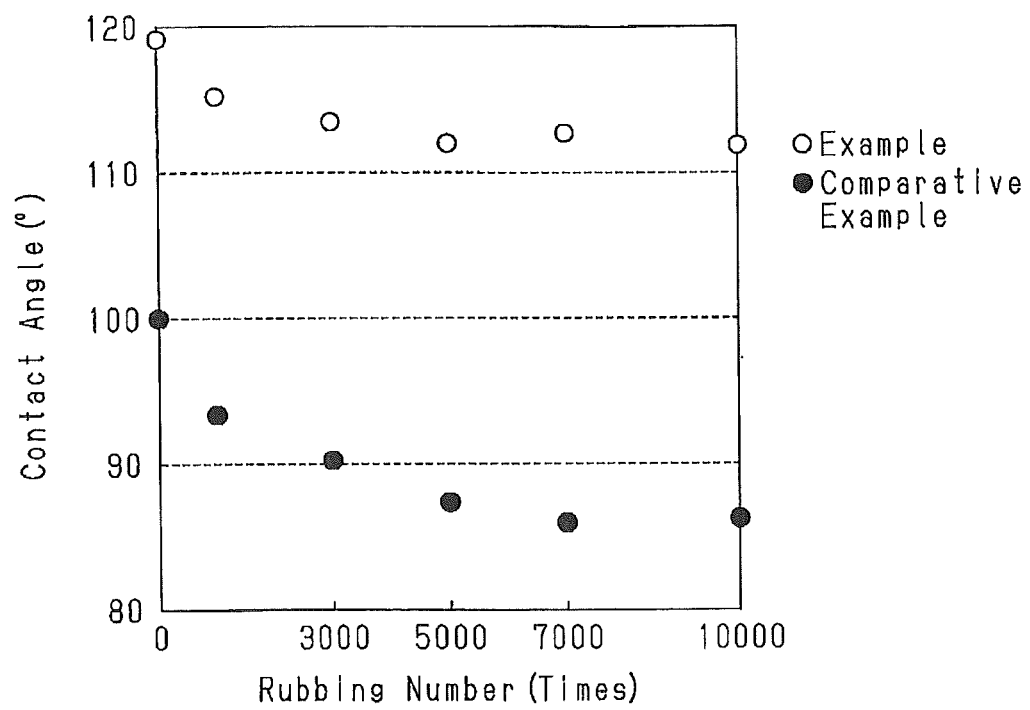

FILM DEPOSITION APPARATUS AND FILM DEPOSITION METHOD

CROSS REFERENCE TO RELATED APPLICATIONS

This application is divisional of U.S. patent application Ser. No. 12/919,577, filed Aug. 26, 2010, which is a national stage application under 35 U.S.C. 371 of PCT Application No. PCT/JP2009/057228 having an international filing date of 8 Apr. 2008, which designated the United States, which PCT application claimed the benefit of Japanese Patent Application No. 2008-101606 filed on Apr. 9, 2008, the entire disclosure of which is hereby incorporated herein by reference.

TECHNICAL FIELD

The present invention relates to a film formation device and a film formation method.

BACKGROUND ART

An optical thin film used in optical products includes a plurality of layers having different refractive indexes. Each layer is stacked onto a substrate to obtain various types of optical characteristics, such as an antireflective characteristic, a filtering characteristic, and a reflective characteristic. For example, an oxide of a metal such as tantalum, titanium, niobium, and zirconium is used as a high refractive index material. For example, a silicon oxide or magnesium fluoride is used as the low refractive index material.

The manufacturing operation for an optical thin film includes the so-called sputtering process, which uses a plurality of targets formed by dielectrics of a low refractive index material, high refractive index material, or the like and sequentially deposits sputtering grains released from the targets onto the substrate. Such type of sputtering process includes a magnetron sputtering process, which implants plasma near the surface of the target, and a high frequency sputtering process, which applies high frequency power to the targets.

When using a dielectric as the target material for the sputtering method, the charge accumulated in the dielectric has a tendency to cause abnormal discharge. Thus, the high frequency sputtering process is generally selected. However, when using the high frequency sputtering process, in comparison to the magnetron sputtering process, the plasma density has a tendency to vary more easily when the substrate undergoes transportation and the like and the film forming speed may be greatly decreased. Various proposals have been made in the prior art for the manufacturing method of the optical thin film to solve such problems.

A film formation device described in patent document 1 arranges a rotary drum inside a vacuum chamber and forms a plurality of processing regions inside the vacuum chamber in the circumferential direction of the rotary drum. For example, a processing region for forming a metal layer using the magnetron sputtering process, a processing region for forming a silicon layer using the magnetron sputtering process, and a processing region for generating oxygen plasma and performing an oxidation process are formed around the rotary drum. The film formation device described in patent document 1 rotates the rotary drum to selectively and repetitively perform the formation of a metal layer, the formation of a silicon layer, and the oxidation of each layer on the surface of a substrate mounted on the rotary drum. Patent document 1 allows for the deposition of the high refractive index material and the deposition of the low refractive index material to be accelerated under stable deposition conditions. This increases the stability and speed of the process for forming the optical thin film.

The optical characteristics of optical thin films used in optical products easily deteriorate when various types of liquids from the exterior collect on the surface of the thin film. Thus, it is desirable that a liquid repellent film having liquid repellency for repelling various types of liquids be formed on the surface of the optical thin film. In an operation for forming the liquid repellent film, a dipping process is first performed using a silane coupling agent, which contains a liquid repellent group for repelling liquid and a hydrolytic condensation group, to form a dipping layer containing the silane coupling agent on the surface of the optical thin film. Subsequently, water is supplied to the dipping layer formed on the optical thin film to polycondense the silane coupling agent and thereby form the liquid repellent film.

However, when forming the liquid repellent film in the above-described operation, water acting as a polycondensation initiator is supplied from the surface of the dipping layer. This initiates polycondensation of the surface of the dipping layer before the interior of the dipping layer and advances polymerization of the dipping layer thereby causing high polymerization of the dipping layer. As a result, it becomes difficult for the water to reach the interior of the dipping layer and the vicinity of the substrate. This lowers the polymerization rate of the silane coupling agent accordingly and slows reaction with the substrate. Thus, it becomes difficult to obtain mechanical strength of the liquid repellent film and adhesion or the like between the liquid repellent film and optical thin-film. This may result in separation of the liquid repellent film.

SUMMARY OF THE INVENTION

The present invention provides a film formation device and a film formation method that increase the mechanical resistance of the liquid repellant film formed on the oxide film.

One aspect of the preset invention is a film formation device. The film formation device includes an oxide film formation unit that forms an oxidized film on a substrate by releasing grains towards the substrate, which is rotated in a vacuum chamber, and forms an oxide film on the rotated substrate by emitting oxygen plasma towards the oxidized film on the rotating substrate. A vapor deposition unit vaporizes a silane coupling agent, which contains a hydrolytic polycondensation group and a liquid repellent group, towards the rotated substrate, and vapor-deposits the silane coupling agent on the oxide film. A polycondensation unit polycondenses the silane coupling agent by supplying water towards the oxide film on the rotated substrate. The polycondensation unit supplies the water to the oxide film before the vapor deposition unit vapor-deposits the silane coupling agent on the oxide film.

A further aspect of the present invention is a film formation method. The method includes forming an oxidized film on a substrate by releasing grains towards the substrate, which is rotated in a vacuum chamber, forming an oxide film on the substrate by emitting oxygen plasma towards the oxidized film on the rotated substrate, and forming a liquid repellent film on the oxide film by supplying a silane coupling agent, which contains a hydrolytic polycondensation group and a liquid repellent group, and water towards the oxide film. Said forming a liquid repellent film includes supplying the water to the oxide film before supplying the silane coupling agent to the oxide film.

The present invention produces a polycondensing reaction between the silane coupling agent and the substrate and increases the adhesion between the silane coupling agent and substrate. Accordingly, a film formation device and a film formation method are provided that increase the mechanical resistance of the liquid repellant film formed on the oxide film.

BRIEF DESCRIPTION OF THE DRAWINGS

FIG. 5 is a diagram illustrating the friction resistance of a liquid repellent film.

DETAILED DESCRIPTION OF THE EMBODIMENTS

Figure 1:
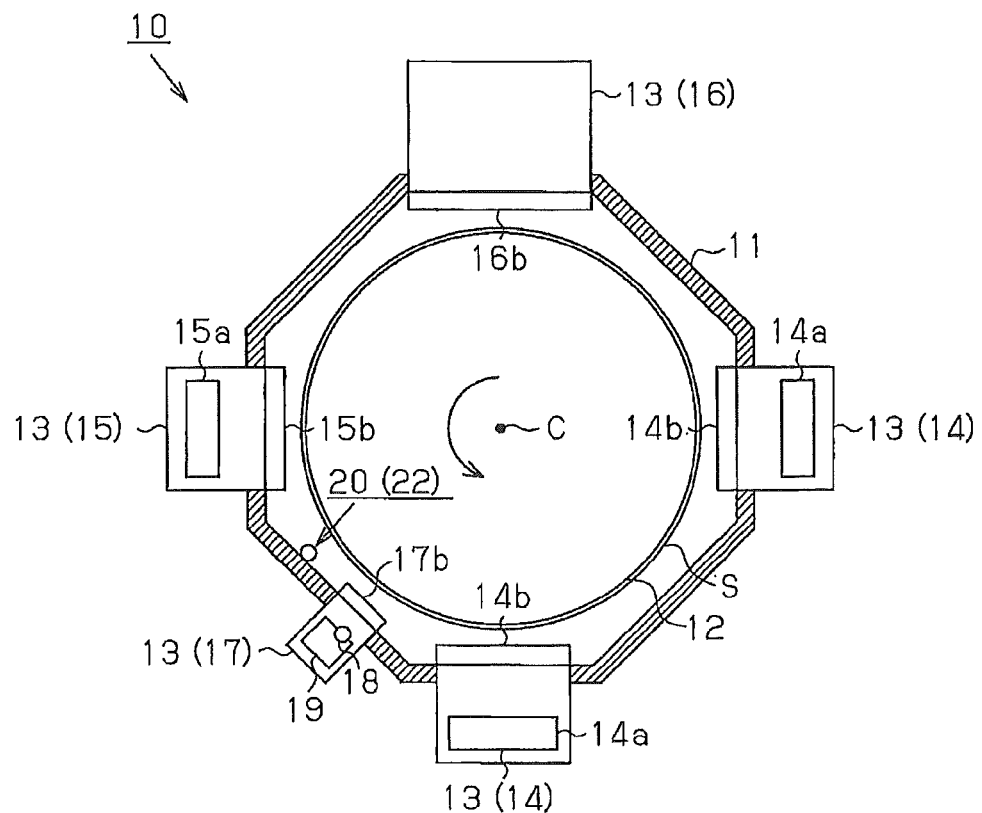
FIG. 1 is a schematic diagram showing a film formation device.
Figure 2:
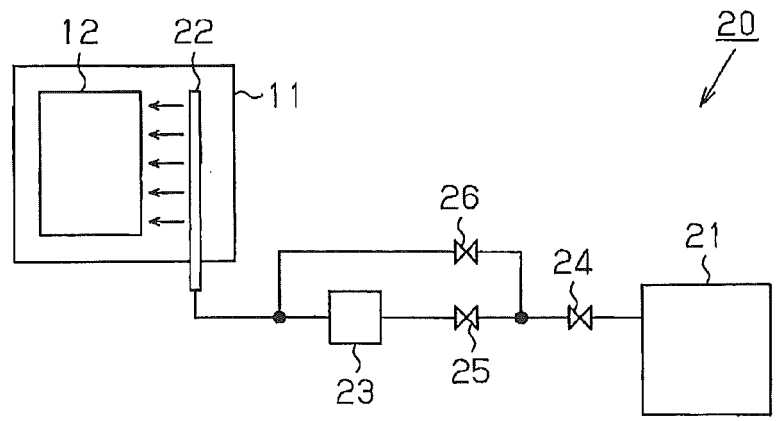
FIG. 2 is a schematic diagram showing a polycondensation unit.

A film formation device 10 according to one embodiment will now be described with reference to the drawings. FIG. 1 is a schematic plan view showing the film formation device 10. FIG. 2 is a schematic diagram showing a polycondensation unit 20. In FIG. 1, the film formation device 10 includes a vacuum chamber 11, which has the shape of a polygonal case extending in a vertical direction with respect to the plane of the drawing (hereinafter simply referred to as the rotational axis direction).

The vacuum chamber 11 includes therein a cylindrical rotary drum 12 extending in the rotational axis direction. The rotary drum 12 is one example of a rotary mechanism. The rotary drum 12 rotates about its center axis (hereinafter simply referred to as the rotation axis C) in the counterclockwise direction (direction of the arrow shown in FIG. 1) at a predetermined rotation speed such as 100 rpm. The rotary drum 12 is a holder that holds in a separable manner a substrate S serving as a film formation subject along its outer circumferential surface. The rotary drum 12 rotates the substrate S in the circumferential direction of the rotary drum 12 while keeping the surface of the substrate S facing toward the inner surface of the vacuum chamber 11.

The vacuum chamber 11 includes a plurality of surface processing units 13 arranged along the rotational direction of the rotary drum 12. The plurality of surface processing units 13 supply film formation grains that form the film formation material, oxidation gas, silane coupling agent, and water towards the outer circumferential surface of the rotary drum 12, that is, the surface of the substrate S.

In one example, the vacuum chamber 11 includes a first film formation processing unit 14 for supplying metal grains to the substrate S, a second film formation processing unit 15 for supplying silicon grains to the substrate S, and an oxidation processing unit 16 for supplying active oxygen to the substrate S. The first film formation processing unit 14, the second film formation processing unit 15, and the oxidation processing unit 16 are examples of an oxide film formation unit. The example shown in FIG. 1 includes a plurality of (e.g., two) first film formation processing units 14. The vacuum chamber 11 also includes a vapor deposition unit 17 for supplying the substrate S with the silane coupling agent, and the polycondensation unit 20 for supplying the substrate S with water, which initiates polycondensation with the silane coupling agent. In one example, the polycondensation unit 20 is arranged opposite to the rotational direction of the rotary drum 12 as viewed from the vapor deposition unit 17. In other words, the polycondensation unit 20 is arranged upstream of the vapor deposition unit 17 with respect to the rotational direction of the substrate S. Accordingly, the substrate S that rotates about the rotation axis C faces toward the polycondensation unit 20 and then faces toward a vapor deposition source 18.

The first film formation processing unit 14 includes a first target 14a, which is formed from a metal such as tantalum and aluminum, an electrode (not shown) for sputtering the first target 14a, and a first shutter 14b for opening and closing the side closer to the rotary drum 12 when viewed from the first target 14a. When performing a film formation process, the first film formation processing unit 14 opens the first shutter 14b to supply the metal grains released from the first target 14a to the outer circumferential surface of the rotary drum 12, that is, the surface of the substrate S. As a result, the first film formation processing unit 14 forms a metal film that forms an oxidized film on the surface of the substrate S. When the film formation process is not performed, the first film formation processing unit 14 closes the first shutter 14b to prevent the first target 14a from being contaminated by other elements.

The second film formation processing unit 15 includes a second target 15a, which is formed from silicon, an electrode (not shown) for sputtering the second target 15a, and a second shutter 15b for opening and closing the side closer to the rotary drum 12 when viewed from the second target 15a. When performing a film formation process, the second film formation processing unit 15 opens the second shutter 15b to supply the silicon grains released from the second target 15a to the surface of the substrate S. As a result, the second film formation processing unit 15 forms a silicon film that forms an oxidized film on the surface of the substrate S. When the film formation process is not performed, the second film formation processing unit 15 closes the second shutter 15b to prevent the second target 15a from being contaminated by other elements.

The oxidation processing unit 16, which is an oxygen plasma source for generating plasma with oxygen gas, holds an oxidation shutter 16b for opening and closing the side closer to the rotary drum 12. When performing an oxidation process, the oxidation processing unit 16 opens the oxidation shutter 16b to emit the oxygen plasma generated by the oxygen plasma source toward the surface of the substrate S. As a result, the oxidation processing unit 16 oxidizes the metal film or silicon film formed on the substrate S to form a metal oxide film or silicon oxide film. When the oxidation process is not performed, the oxidation processing unit 16 closes the oxidation shutter 16b to prevent the plasma source from being contaminated by other elements.

The vapor deposition unit 17 includes a vapor deposition source 18 for accommodating the silane coupling agent containing a liquid repellent group, a heater 19 for heating the vapor deposition source 18, and a third shutter 17b for opening and closing the side closer to the rotary drum 12 as viewed from the vapor deposition source 18. The vapor deposition unit 17, which is formed to be tubular so as to extend along the rotational axis direction, allows for the silane coupling agent accommodated in the tube to be vapor-deposited over the entire width in the rotational axis direction of the substrate S. When forming the liquid repellent film, the vapor deposition unit 17 drives the heater 19 and opens the third shutter 17b to vapor-deposit the silane coupling agent, which is released from the vapor deposition source 18, on the substrate S. When the liquid repellent film is not formed, the vapor deposition unit 17 closes the third shutter 17b to prevent the vapor deposition source 18 from being contaminated by other elements.

In FIG. 2, the polycondensation unit 20 includes a storage tank 21, which is for storing water, and a shower head 22, which is for supplying the water from the storage tank 21 towards the substrate S. The storage tank 21 uses the pressure difference with the vacuum chamber 11 to guide the water it is storing toward the shower head 22. The shower head 22 is formed to be tubular and extends along the axial direction of the rotation axis C so as to allow for the water from the storage tank 21 to be supplied over the entire width in the rotational axis direction of the substrate S.

The polycondensation unit 20 includes a mass flow controller 23, a supply valve 24, and a main valve 25 between the storage tank 21 and the shower head 22. When supplying water to the substrate S, the polycondensation unit 20 opens the supply valve 24 and the main valve 25 and adjusts the supplied amount of the water to a predetermined value using the mass flow controller 23. The polycondensation unit 20 includes a bypass valve 26 arranged in a bypass line connecting the supply valve 24 and the shower head 22. When setting the storage tank 21, the polycondensation unit 20 opens the bypass valve 26 in a state in which the main valve 25 closed and discharges the residual gas in the storage tank 21 to the vacuum chamber 11. When supplying water towards the substrate S, this allows for the polycondensation unit 20 to supply the water with a higher purity.

When forming the liquid repellent film on the silicon oxide film (or metal oxide film), the polycondensation unit 20 drives the mass flow controller 23 before the third shutter 17b opens and supplies water at a predetermined flow rate to the surface of the rotating oxide film. The polycondensation unit 20 thus causes the water from the shower head 22 to collect on the surface of an oxide film before the silane coupling agent from the vapor deposition source 18 reaches the surface of the oxide film. The water collected on the surface layer of the oxide film condenses the following silane coupling agent and surface layer of the oxide film and also polycondenses the following silane coupling agent.

Further, when the silane coupling agent is being supplied towards the oxide film, the polycondensation unit 20 drives the mass flow controller 23 and continues to supply water at the predetermined flow rate onto the oxide film. Thus, when the substrate S rotates once, water corresponding to a single rotation reacts with the silane coupling agent corresponding to a single rotation on the entire oxide film, and the water corresponding to a single rotation causes the silane coupling agent corresponding to a single rotation to start polycondensation. In other words, when the substrate S rotates once, only the silane coupling agent corresponding to a single rotation polycondenses and forms a liquid repellent film corresponding to a single rotation and having a high polymerization rate. The polycondensation unit 20 stacks the liquid repellent film corresponding to each rotation whenever the substrate S rotates. This increases the polymerization rate in the planar direction of the substrate S and the thickness direction of the liquid repellent film.

Figure 3:
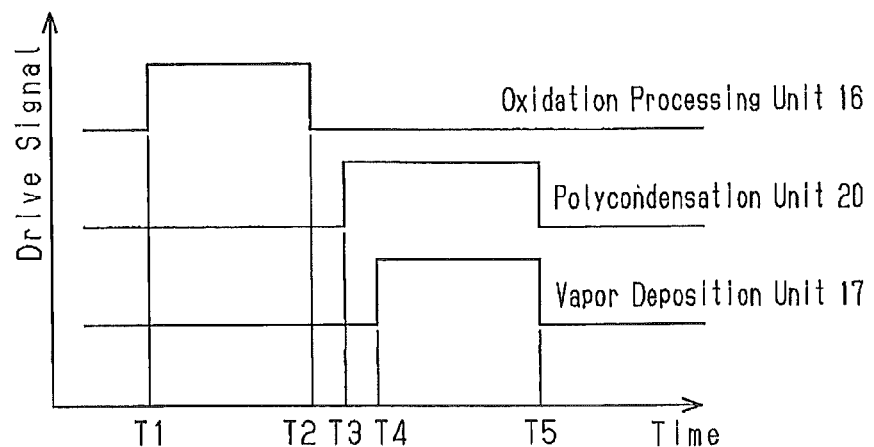
FIG. 3 is a timing chart illustrating a film formation process.

The film formation method for forming an optical thin film with the film formation device 10 will now be discussed. FIG. 3 is a timing chart of drive signals related to the oxidation processing unit 16, the polycondensation unit 20, and the vapor deposition unit 17.

When forming the optical thin film on the substrate S, the film formation device 10 first rotates the rotary drum 12 at a predetermined speed and drives the first film formation processing unit 14, the second film formation processing unit 15, and the oxidation processing unit 16 in a state in which the first shutter 14b, the second shutter 15b, the oxidation shutter 16b, and the third shutter 17b are closed.

Then, the film formation device 10 opens the first shutter 14b while rotating the rotary drum 12 to form the metal film on the surface of the substrate S. In this case, the film formation device 10 opens the oxidation shutter 16b to sequentially oxidize the metal film on the outermost surface and form the metal oxide film on the substrate S.

After forming the metal oxide film, the film formation device 10 opens the second shutter 15b while rotating the rotary drum 12 to form a silicon film on the surface of the metal oxide film. In this case, as shown in FIG. 3, when the processing time reaches the oxidation start time T1, the film formation device 10 opens the oxidation shutter 16b and keeps it open until the processing time reaches the oxidation end time T2 to sequentially oxidize the silicon film on the outermost surface and form a silicon oxide film on the metal oxide film.

When the processing time reaches the polycondensation start time T3, the film formation device 10 drives the polycondensation unit 20 until the processing time reaches the polycondensation end time T5 to continuously supply water towards the silicon oxide film. During this period, the film formation device 10 opens the third shutter 17b when the processing time reaches the vapor deposition start time T4 and keeps it open until the processing time reaches the polycondensation end time T5 to supply a silane coupling agent such as $C_8F_{17}C_2H_4Si(OCH_3)_3$ towards the silicon oxide film. This forms the liquid repellent film.

In this case, the film formation device 10 drives the mass flow controller 23 before opening the third shutter 17b of the vapor deposition unit 17 and supplies water at a predetermined flow rate to the surface of the silicon oxide film. The water that collects on the surface layer of the silicon oxide film condenses the following silane coupling agent and surface layer of the silicon oxide film and also polycondenses the following silane coupling agent. In other words, the silane coupling agent $C_8F_{17}C_2H_4Si(OCH_3)_3$ has a terminal portion terminating with a methoxy group. When water is supplied, a dealcoholization reaction occurs with the water, and the terminal portion becomes the hydroxyl group. Further, a polycondensation reaction occurs with the underlying $SiO_2$ thereby resulting in a strong adhesion with the substrate. Thus, it is significant that the supply be performed just before vapor deposition occurs in vacuum. The film formation device 10 thereby obtains high adhesiveness at the interface between the liquid repellent film and the silicon oxide film.

The film formation device 10 continues to supply water from the shower head 22 towards the substrate S while supplying the silane coupling agent towards the substrate S. Thus, the film formation device 10 stacks a liquid repellent film having a high polymerization rate whenever the substrate S rotates. As a result, the film formation device 10 increases the adhesiveness between the liquid repellent film and the silicon oxide film and uniformly polycondenses silane coupling agent over the entire liquid repellent film. Further, the mechanical resistance of the liquid repellent film formed on the silicon oxide film is increased.

EXAMPLE

The mechanical resistance of a liquid repellent film formed with the film formation device 10 will be described below.

First, the flow rate of the water during film formation was set based on the liquid repellency of the liquid repellent film.

Figure 4:
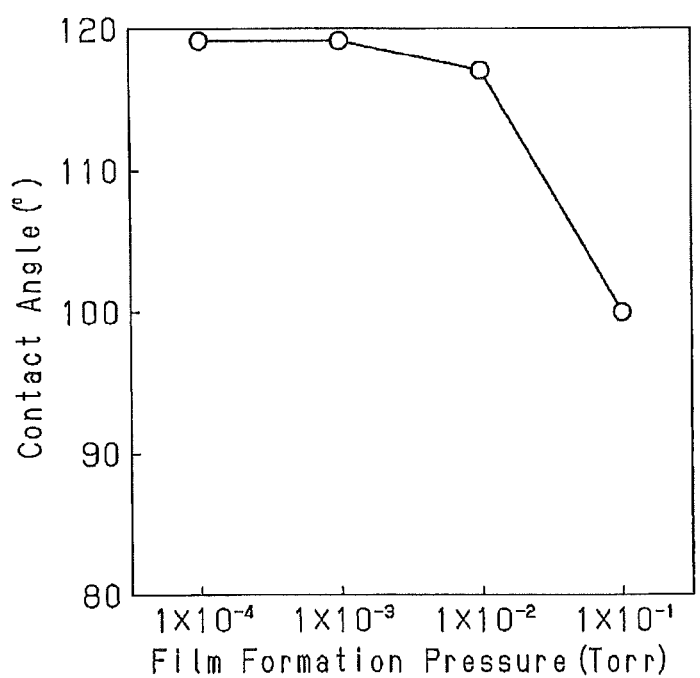
FIG. 4 is a diagram showing the relationship between a contact angle and a film formation pressure.

In one example, the supplied amount of the silane coupling agent was set to a constant amount and liquid repellent films were formed under a plurality of film forming conditions in which only the flow rate of water was changed. An angle (hereinafter simply referred to as water contact angle) formed by the surface of a water droplet dropped onto the surface of the liquid repellent film and the surface of the liquid repellent film was measured for each liquid repellent film. The relationship between the film formation pressure during formation of each liquid repellent film and the water contact angle is shown in FIG. 4. The film formation pressure shown in FIG. 4 is the pressure between the shower head 22 and the substrate S and is a value proportional to the flow rate of water when forming the liquid repellent film.

In FIG. 4, when the film formation pressure is $10^{-4}$ to $10^{-3}$ torr, a high water contact angle may be recognized at around 120° and it is apparent that the liquid repellent film has sufficient liquid repellence. When the film formation pressure becomes higher than $10^{-3}$ torr, as the film formation pressure increases, that is, as the flow rate during film formation increases, the amount of water during film formation becomes excessive and the water contact angle decreases. When the film formation pressure reaches $10^{-1}$ torr, the water contact angle decreases to 100°. In the present example, the flow rate of water during film formation was set so that the film formation pressure shown in FIG. 4 becomes $10^{-4}$ to $10^{-3}$ torr.

Next, the first film formation processing unit 14 and the oxidation processing unit 16 were driven by rotating the rotary drum 12 at 100 rpm using a substrate S formed from SUS 304 steel and having a thickness of 0.2 mm to form a metal oxide film on the surface of the substrate S. Further, the second film formation processing unit 15 and the oxidation processing unit 16 were driven while rotating the rotary drum 12 to form the silicon oxide film on the metal oxide film. Then, the vapor deposition unit 17 and the polycondensation unit 20 were driven while rotating the rotary drum 12 and the flow rate of the water was set so that the film formation pressure becomes $10^{-4}$ to $10^{-3}$ torr to form the liquid repellent film on the silicon oxide film and obtain the optical thin film of the example. A friction test was conducted on the liquid repellent film of the example under the conditions shown below using a rubbing tester, and the water contact angle was measured for the liquid repellent film after the friction test. The water contact angle of the example is shown in FIG. 5.

An optical thin film of a comparative example was obtained by changing the method for forming the liquid repellent film to the dipping process with the other conditions being the same as the example. In the same manner as the example, the friction test was conducted on the liquid repellent film of the comparative example under the conditions shown below using the rubbing tester, and the water contact angle was measured for the liquid repellent film after the friction test. The water contact angle of the comparative example is shown in FIG. 5.

[Friction Test Conditions]
  load: 500 g/cm²
  friction speed: 14 cm/sec
  friction material: cotton cloth
  number of rubbing tests: 1000 times, 3000 times, 5000 times, 7000 times, 10000 times In FIG. 5, the liquid repellent film of the example gradually decreases the water contact angle as the number of rubbing tests increases. However, the reduction range of the water contact angle is 7° or less until the number of rubbing tests reaches 10000 times. In contrast, the liquid repellent film of the comparative example drastically decreases the water contact angle as the number of rubbing tests increases. The reduction range of the water contact angle is close to 15° until the number of rubbing tests reaches 10000 times. Accordingly, it is apparent that the liquid repellent film of the example has a high mechanical resistance compared to the liquid repellent film of the comparative example.

The film formation device 10 of the embodiment discussed above has the advantages described below.

(1) The film formation device 10 vaporizes the silane coupling agent containing the hydrolytic polycondensation group and the liquid repellent group towards the rotation path of the substrate S to vapor-deposit the silane coupling agent on the oxide film formed on the substrate S. The film formation device 10 polycondenses the silane coupling agent by supplying water towards the rotation path of the substrate S. In this state, the film formation device 10 supplies water onto the oxide film in advance before vapor-depositing the silane coupling agent on the oxide film.

Accordingly, the water that collects on the surface of the oxide film condenses the surface layer of the oxide film and the following silane coupling agent, and also polycondenses the silane coupling agents at the surface layer of the oxide film. Thus, the film formation device 10 increases the adhesiveness between the initial layer of the liquid repellent film and the oxide film. Additionally, the silane coupling agent uniformly polycondenses over the entire initial layer of the liquid repellent film. Thus, the film formation device 10 increases the mechanical resistance of the liquid repellent film formed on the oxide film.

(2) The film formation device 10 continues to supply the water towards the oxide film while vapor-depositing the silane coupling agent on the oxide film. Accordingly, the silane coupling agent and water are alternately and continuously supplied towards the region of the rotating oxide film. This further ensures that the silane coupling agent is polycondensed over the entire liquid repellent film in the film thickness direction. Accordingly, the film formation device 10 further ensures improvement in the mechanical resistance of the liquid repellent film formed on the oxide film.

(3) The film formation device 10 forms the silicon film on the substrate S by releasing silicon grains towards the rotation path of the substrate S and forms the silicon oxide film on the substrate S by emitting oxygen plasma towards the rotation path of the substrate S to oxidize the silicon film. Accordingly, the interface of the liquid repellent film and the oxide film is formed by the silicon coupling agent and the silicon oxide. This further increases the adhesiveness between the initial layer of the liquid repellent layer and the oxide film and further increases the mechanical strength over the entire liquid repellent film.

The embodiment discussed above may be modified as described below.

A structure for forming a liquid repellent film on the silicon oxide film described above is not limited to the foregoing description, and the structure may be such that the liquid repellent film is formed on the metal oxide film.

The rotary drum 12 is cylindrical but not limited in such a manner, and the rotary drum 12 may have a polygonal shape.

The invention claimed is:
1. A method for forming a thin film on a substrate rotated in a vacuum chamber, the method comprising:
  forming an oxidizable film on the substrate by releasing grains towards the rotated substrate;

forming an oxide film on the substrate by emitting oxygen plasma towards the oxidizable film on the rotated substrate; and forming a liquid repellent film on the oxide film by supplying a silane coupling agent, which contains a hydrolytic polycondensation group and a liquid repellent group, and water towards the oxide film;

wherein said forming a liquid repellent film includes:

supplying the water to the oxide film before supplying the silane coupling agent to the oxide film; and continuously supplying the water to the oxide film while vapor-depositing the silane coupling agent on the oxide film.

2. The method according to claim 1, wherein said forming an oxidizable film includes forming a silicon film on the substrate by releasing silicon grains towards the rotated substrate; and said forming an oxide film includes forming a silicon oxide film on the substrate by emitting the oxygen plasma towards the silicon film on the rotated substrate.

* * * * *